(12) United States Patent
Jost et al.

(10) Patent No.: US 7,842,890 B2
(45) Date of Patent: Nov. 30, 2010

(54) ONE-PIECE OPTICAL IMAGER HOUSING AND METHOD FOR RELEASABLY LOCKING A ONE-PIECE HOUSING ASSEMBLY

(75) Inventors: Richard Burnham Jost, Syracuse, NY (US); Harold Francis Rose, Jr., Liverpool, NY (US)

(73) Assignee: Jadak, LLC, North Syracuse, NY (US)

( * ) Notice: Subject to any disclaimer, the term of this patent is extended or adjusted under 35 U.S.C. 154(b) by 133 days.

(21) Appl. No.: 12/234,002

(22) Filed: Sep. 19, 2008

(65) Prior Publication Data

US 2010/0073851 A1    Mar. 25, 2010

(51) Int. Cl.
*H01R 13/502* (2006.01)
(52) U.S. Cl. .................... 174/562; 174/563
(58) Field of Classification Search ........... 174/520, 174/563, 562, 542; 361/752
See application file for complete search history.

(56) References Cited

U.S. PATENT DOCUMENTS

| | | | | |
|---|---|---|---|---|
| 3,349,289 A | * | 10/1967 | Mueller | 361/731 |
| 6,288,329 B1 | * | 9/2001 | Kopp et al. | 174/378 |
| 6,870,739 B2 | * | 3/2005 | Groos et al. | 361/725 |
| 6,946,602 B1 | * | 9/2005 | Gibbs et al. | 174/560 |
| 7,151,672 B2 | * | 12/2006 | Campbell | 361/725 |
| 2001/0025715 A1 | * | 10/2001 | Muller et al. | 174/19 |
| 2005/0257370 A1 | * | 11/2005 | Cunningham et al. | 29/840 |

* cited by examiner

*Primary Examiner*—Hung V Ngo
(74) *Attorney, Agent, or Firm*—David L. Nocilly; Blaine T. Bettinger; Bond Schoeneck & King, PLLC

(57) ABSTRACT

A one-piece housing for the enclosure and protection of an optical imager or other device and a method for locking a one-piece housing assembly in a folded configuration. The housing comprises three segments permanently joined by flexible hinges that allow the housing to quickly fold into a box to enclose an optical imager. To releasably maintain the housing in closed position, the assembly contains two locking tabs that snap-fit into depressions on a platform extending away from the main housing segment. One tab snap-fits directly into a depression on the top surface of the platform while the other tab snap-fits into a depression on the reverse surface of the platform. By locking into depressions on the top and reverse surfaces of the platform, the opposing tabs tightly grip the surfaces and releasably maintain the housing in the folded configuration.

9 Claims, 1 Drawing Sheet

ONE-PIECE OPTICAL IMAGER HOUSING AND METHOD FOR RELEASABLY LOCKING A ONE-PIECE HOUSING ASSEMBLY

BACKGROUND OF THE INVENTION

1. Field of the Invention

The present invention relates to housing for optical imagers, and, more particularly, to a one-piece housing for the enclosure and protection of an optical imager.

2. Description of Prior Art

Optical imaging devices have many uses including reading barcodes, translating text into digital characters, and capturing digital images or video files. These devices may be used in manufacturing processes as well as in products for both consumers and businesses. To scan a barcode, for example, the imaging device captures an image of the barcode and then processes the image to decode the information. Optical imaging devices are generally composed of an optical lens, a sensor, a circuit board, and an imager housing.

Optical imager housings in the prior art are typically multi-piece construction where the imaging components are placed between separable housing pieces that must be affixed together to form a single unit. The use of multiple housing components has several disadvantages. First, multi-piece construction significantly increases costs by requiring a different mold for each piece. Additionally, multi-piece housings necessitate the additional step of affixing the individual pieces to each other, thereby increasing assembly time and costs. Multi-piece housings also require additional material such as glue, screws, rivets, or other affixing means to lock individual pieces together.

SUMMARY OF THE INVENTION

It is therefore a principal object and advantage of the present invention to provide a one-piece optical imager housing to reduce manufacturing costs and assembly time.

It is a further object and advantage of the present invention to provide a one-piece optical imager housing manufactured from a single mold.

It is also an object and advantage of the present invention to provide an easy and low-cost locking mechanism and method for enclosing an imaging device within the one-piece housing.

Other objects and advantages of the present invention will in part be obvious, and in part appear hereinafter.

In accordance with the foregoing objects and advantages, the present invention provides a device for the enclosure and protection of an electronic device such as an optical imager. The present invention is preferably adapted for low-cost manufacturing and rapid assembly.

In its preferred form, the present invention provides a one-piece housing assembly for an optical imager comprising separate segments that are integrally formed and joined by flexible hinges which allow the housing to quickly fold into an enclosure for encompassing an optical imaging unit or imaging assembly. In a preferred embodiment, the assembly includes a locking mechanism that selectively maintains the housing in the closed position. The locking mechanism includes two T-shaped locking tabs that snap-fit into two T-shaped apertures on a receiving portion formed into the housing enclosure. One of the T-shaped tabs snap-fits directly into one of the apertures from the top surface of the enclosure, while the other tab snap-fits into a receiving aperture located on the reverse surface of the enclosure. By locking the T-shaped tabs into the corresponding apertures on the top and reverse surfaces of the platform, the opposing tabs tightly grip the enclosure and releasably maintain the housing in the folded configuration.

A further embodiment of the invention permits the device to protect an opening for the imager optics or other associated device. A protective shield incorporated into the middle segment of the one-piece construction around the optic cavity protects and shields the optical imager.

BRIEF DESCRIPTION OF THE DRAWINGS

The present invention will be more fully understood and appreciated by reading the following Detailed Description in conjunction with the accompanying drawings, in which.

DETAILED DESCRIPTION OF THE INVENTION

Figure 1:
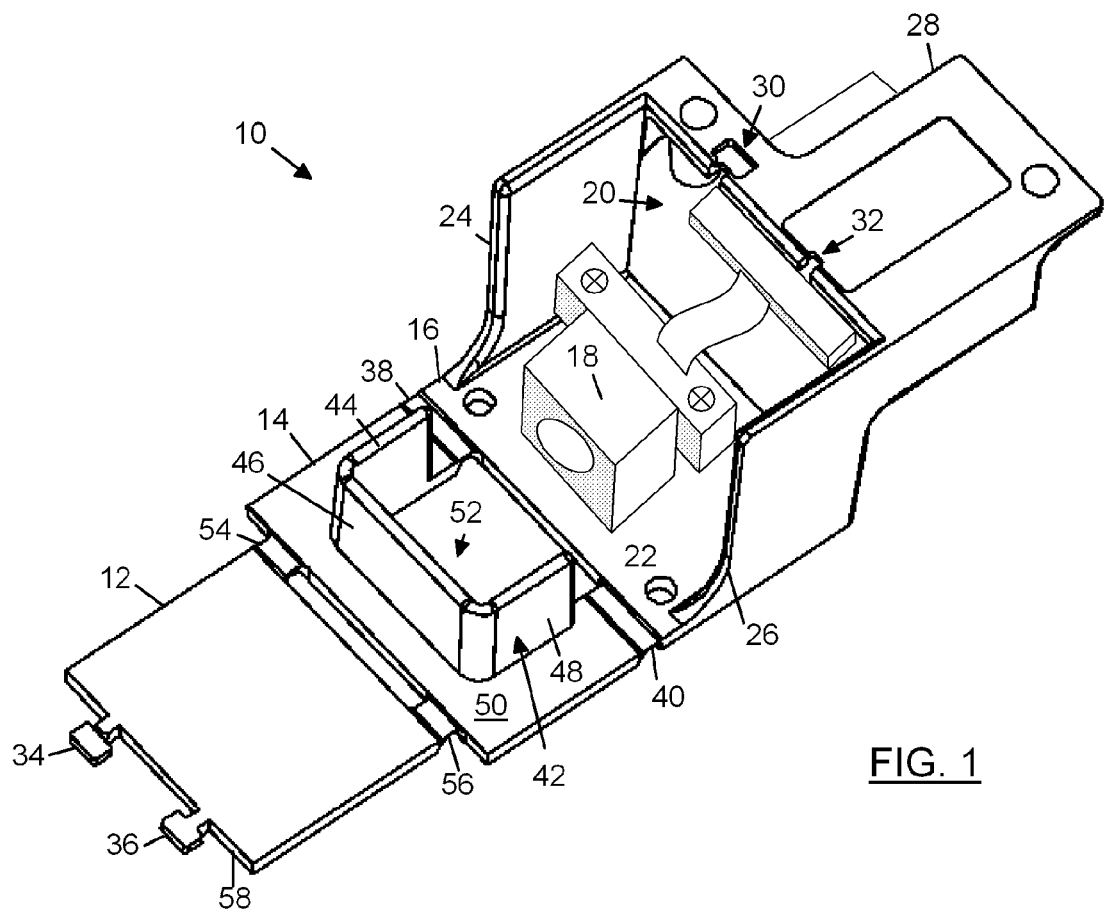
FIG. 1 is a perspective view of the present invention in the unfolded configuration and housing an optical imager.
Figure 2:
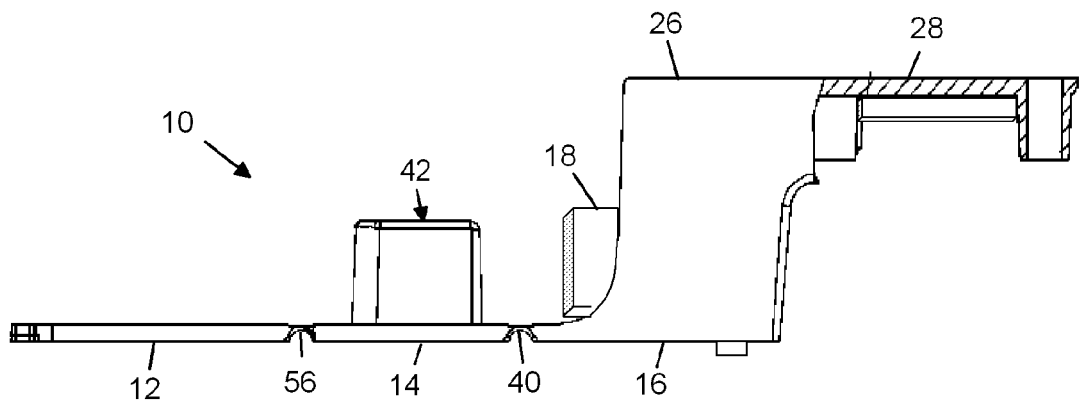
FIG. 2 is a side view of the present invention in the unfolded configuration.

Referring now to the drawings wherein like reference numerals designate identical or corresponding parts throughout the several views, there is shown in FIG. 1 a top view of an example embodiment of the present invention. The one-piece housing unit 10 includes an outer housing segment 12, a middle housing segment 14, and a main housing segment 16. In the embodiment shown, housing unit 10 is sized and constructed to hold a conventional optical imaging unit 18.

Main housing segment 16 includes a cavity 20 formed therethrough and defined by a base 22 and two walls 24 and 26. Base 22 of segment 16 can include means for affixing an optical imager or other unit to the housing, including a clamp, clip, snap, hook and loop fastening, crimping, welding, soldering, adhesives such as glue or tape, or one, two, or more holes for screws, rivet, nails, bolts, pins, or fasteners, among other affixing means.

Extending from main housing segment 16 is an elongated platform 28 formed by an extension of the upper region of walls 24 and 26. In one embodiment, platform 28 serves as a protective shield for a circuit board or other component, and can include means to affix the component to the platform. Platform 28 can be formed into any size or shape needed to provide room for components associated with the optical imager or other device housed in unit 10.

The present invention includes a locking mechanism for releasably maintaining housing assembly 10 in a folded configuration. In one embodiment, locking comprises two depressions 30 and 32 formed in platform 28 which releasably or permanently receive two matching locking tabs 34 and 36 positioned on outer housing segment 12. Depression 30 is formed in the top surface of platform 28 and receives matching locking tab 34, which snap-fits into depression 30. Depression 32 is formed in the reverse surface of platform 28 and receives matching locking tab 36, which snap-fits into depression 32. In a preferred embodiment of the present invention, the tabs and depressions are T-shaped. When both tabs 34 and 36 are snap-fit into depressions 30 and 32, respectively, the housing assembly 10 encloses the imaging unit 18 and is retained in a folded configuration, as seen in FIG. 3.

Middle housing segment 14 is flexibly attached to main housing segment 16 by two living hinges 38 and 40. Middle housing segment 14 optionally includes a shield 42 formed from walls 44, 46, and 48, which extend outwardly from the upper surface 50 of middle housing segment 14 to surround and define an aperture 52 formed in middle housing segment 14. Shield 42 protects optical imager 18 or other device housed in housing assembly 10 when it is positioned in the folded configuration.

Outer housing segment 12 is flexibly attached to middle housing segment 14 by two living hinges 54 and 56. As described above, outer segment 12 includes two locking tabs 34 and 36 that protrude outwardly from the perimeter 58 of segment 12. It should be recognized by those of skill in the art that when outer segment 12 and middle segment 14 are appropriate dimensioned, the segments may be folded from a open configuration into a folded configuration where tabs 34 and 36 may be snap-fit into depressions 30 and 32 to retain unit 10 in the folded configuration, thereby enclosing and protecting optical imager 18 or a similar device.

What is claimed is:

1. A one-piece housing assembly for an electronic device, comprising:

a first segment having a base including a peripheral edge, a first wall integrally formed with and extending upwardly from said base, a second wall integrally formed with said base and extending upwardly from said base in spaced apart relation to said first wall, and a third wall integrally formed with said first and second walls and having a leading edge, wherein said third wall extends between said first and second walls and is spaced apart from said base to define a cavity dimensioned to hold an optical imager;

a second segment flexibly attached to said peripheral edge of said first segment by a first hinge;

a third segment flexibly attached to said second segment by a second hinge and having a forward edge; and a locking mechanism integrally formed with and extending from said forward edge of said third segment and adapted to connect said forward edge of said third segment to said leading edge of said third wall when said second segment is moved about said first hinge and said third segment is moved about said second hinge to position said housing assembly in a closed configuration.

2. The one-piece housing assembly of claim 1, wherein said first and second hinges are living hinges.

3. The one-piece housing assembly of claim 1, wherein an aperture is defined in said second housing segment.

4. The one-piece housing assembly of claim 3, wherein said second segment includes a shield extending perpendicularly from said second segment and positioned to at least partially surround said aperture and said optical imager when said housing assembly is in the closed position.

5. The one-piece housing assembly of claim 1, further comprising a platform extending from said third wall opposite from said leading edge of said third wall.

6. The one-piece housing assembly of claim 1, wherein said locking mechanism comprises first and second locking tabs extending from said forward edge of said third segment.

7. The one-piece housing assembly of claim 6, wherein said leading edge of said third wall includes first and second depressions formed therein that are configured to releasably mate with said first and second locking tabs.

8. The one-piece housing assembly of claim 6, wherein said first and second locking tabs are T-shaped and said first and second depressions are correspondingly T-shaped to accept said first and locking tabs therein.

9. The one-piece housing assembly of claim 6, wherein said first and second depressions are formed in opposing surfaces of said leading edge of said third wall so that said first tab interlocks with said first depression in a first direction and said second tab interlocks with said second depression in a second direction that is opposite to said first direction.

* * * * *